United States Patent [19]

Ali et al.

[11] Patent Number: 5,534,381

[45] Date of Patent: Jul. 9, 1996

[54] ACETAL POLYMERS USEFUL IN PHOTOSENSITIVE COMPOSITIONS

[75] Inventors: M. Zaki Ali; Mahfuza B. Ali, both of Mendota Heights, Minn.

[73] Assignee: Minnesota Mining and Manufacturing Company, St. Paul, Minn.

[21] Appl. No.: 498,881

[22] Filed: Jul. 6, 1995

[51] Int. Cl.$^6$ ............................. G03F 7/021; G03C 1/54; G03C 1/77

[52] U.S. Cl. .................. 430/156; 430/175; 430/176; 430/270.1; 430/278.1; 430/302; 525/61

[58] Field of Search .................................. 430/175, 176, 430/157, 278.1, 302, 270.1; 525/60, 61

[56] References Cited

U.S. PATENT DOCUMENTS

| | | | |
|---|---|---|---|
| 3,615,552 | 10/1971 | Danhauser et al. | 430/536 |
| 3,647,464 | 3/1972 | Smith et al. | 430/232 |
| 3,847,614 | 11/1974 | Mattor | 430/175 |
| 3,943,150 | 3/1976 | Kashkina et al. | 260/340.7 |
| 4,186,006 | 1/1980 | Kobayashi et al. | 430/302 |
| 4,210,564 | 7/1980 | Pouchol | 260/29.6 B |
| 4,353,804 | 10/1982 | Green et al. | 252/8.5 A |
| 4,652,604 | 3/1987 | Walls et al. | 522/63 |
| 4,741,985 | 5/1988 | Aoai et al. | 430/175 |
| 4,940,646 | 7/1990 | Pawlowski | 430/175 |
| 5,169,897 | 12/1992 | Walls | 525/61 |
| 5,169,898 | 12/1992 | Walls et al. | 525/61 |
| 5,219,699 | 6/1993 | Walls et al. | 430/156 |
| 5,262,270 | 11/1993 | Walls | 430/156 |
| 5,275,907 | 1/1994 | Walls | 430/175 |
| 5,316,892 | 5/1994 | Walls et al. | 430/175 |

*Primary Examiner*—John S. Y. Chu
*Attorney, Agent, or Firm*—Gary L. Griswold; Walter N. Kirn; Susan Moeller Zerull

[57] ABSTRACT

This invention is an acetal polymer having the following repeating units:

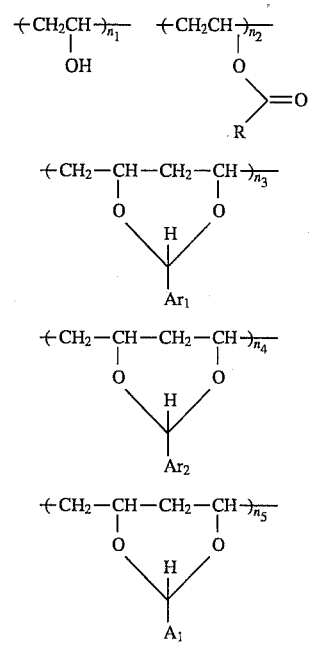

where
  R is an alkyl group of 1 to 10 carbon atoms;
  $Ar_1$ is an aromatic group substituted with an aliphatic group containing 3 to 20 carbon atoms or an alkoxy group having 3 to 20 carbon atoms;
  $Ar_2$ is a non-substituted aromatic group;
  $A_1$ is an acid group;
  $n_1$, $n_2$, $n_3$, $n_4$, $n_5$ represent the molar percents of the respective repeating units and $n_1$ is 0–20 mole %, preferably 2–10 mole %; $n_2$ is 2–20 mole %, preferably 5 to 15 mole %; $n_3$ is 15–85 mole %, preferably 20 to 65 mole %; $n_4$ is 0 to 40 mole %, preferably 0 to 20 mole %; and $n_5$ is 5–40 mole %, preferably 20 to 35 mole %. These polymers may be used in photosensitive compositions and lithographic printing plates.

11 Claims, No Drawings

ACETAL POLYMERS USEFUL IN PHOTOSENSITIVE COMPOSITIONS

FIELD OF THE INVENTION

This invention relates to novel aqueous dispersible or aqueous soluble polyvinyl acetal resins. This invention also relates to the use of these resins as a component of a photosensitive composition, especially for lithographic printing plates.

BACKGROUND OF THE INVENTION

Lithographic printing plates are commonly used in the graphic arts. Most lithographic printing plates comprise a metal substrate coated with a layer of radiation sensitive composition. To form a printing plate, the printer imagewise exposes the radiation sensitive layer to activating wavelengths of actinic radiation. Depending on the nature of the radiation sensitive composition, this exposure will either promote polymerization or curing of the radiation sensitive composition (a negative system) or will cause degradation of the radiation sensitive composition (a positive system). In a negative system, the printer ordinarily develops the imagewise exposed plate by removing the unexposed portions of the radiation sensitive layer.

The radiation sensitive layers in negative systems frequently comprise a diazonium compound and a polymeric binder. Such radiation sensitive layers are typically either "aqueous" developable or "solvent" developable. Solvent developable printing plates typically have good durability and solvent resistance because they use tough polymeric binders. Unfortunately, the use and disposal of the solvent developer creates safety and environmental concerns. Aqueous developable printing plates are much more acceptable with regard to safety and environmental issues, but tend to be less durable and resistant to solvents. The choice of binder is known to affect the durability and solvent resistance of aqueous developable printing plates.

Several U.S. Patents teach the use of specific acetal polymers as the binder for the radiation sensitive layer of a lithographic printing plate. U.S. Pat. No. 3,847,614 discloses an acetal polymer having an aromatic substituted acetal group and a carboxylic acid group.

U.S. Pat. No. 4,652,604 teaches the use of polyacetals comprising six membered cyclic acetals, five membered cyclic acetals and intermolecular acetals. U.S. Pat. No. 4,741,985 teaches the use of an acetal polymer having a six membered cyclic acetal group. The acetal polymers of U.S. Pat. No. 4,940,646 comprise six membered cyclic acetal units derived from an aldehyde that contains hydroxyl groups.

U.S. Pat. Nos. 5,219,699 and 5,169,898 disclose the use of acid substituted ternary acetal polymers. These polymers comprise six membered cyclic acetal repeating groups of three types: (1) unsubstituted or substituted with an alkyl or hydroxyalkyl group, (2) substituted with an aromatic or an heterocyclic moiety, and (3) substituted with a group containing an acid moiety.

U.S. Pat. No. 5,169,897 discloses the use of binary acetal polymers comprising (1) an unsubstituted or alkyl or hydroxyl alkyl substituted, six-membered cyclic acetal and (2) an aromatic or heterocyclic substituted, six-membered cyclic acetal.

All of the above polymers require the presence of aliphatic substituted or non-substituted cyclic acetals. In fact, U.S. Pat. Nos. 5,219,699 and 5,169,898 indicate that if the alkyl or hydroxyalkyl substituted cyclic acetal is missing the performance of plates made with the polymer deteriorates.

While lithographic printing plates using the above mentioned acetal polymers generally perform in an effective manner, improvements in solvent resistance and press durability remains a critical need in the art.

SUMMARY OF THE INVENTION

We have now discovered novel acetal polymers which provide the above mentioned desired properties. These novel acetal polymers contain multiple acetal groups that have specific aromatic and acid pendant groups. These uniquely substituted acetal polymers, in combination with diazo resins, provide highly solvent resistant and durable printing plates that can be developed by mildly alkaline to neutral pH developers.

Therefore, according to a first embodiment, this invention comprises acetal polymers having the following units within the polymer backbone:

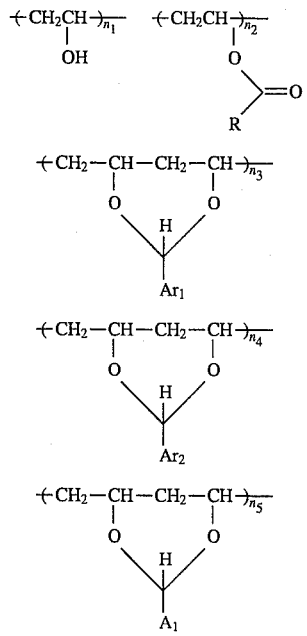

where

R is an alkyl group of 1 to 10 carbon atoms;

$Ar_1$ is an aromatic group substituted with a) an aliphatic group containing 3 to 20 carbon atoms or b) an alkoxy group having 3 to 20 carbon atoms;

$Ar_2$ is a non-substituted aromatic group;

$A_1$ is an acid group;

$n_1$, $n_2$, $n_3$, $n_4$, $n_5$ represent the molar percents of the respective repeating units and $n_1$ is 0–20 mole %, preferably 2–10 mole %; $n_2$ is 2–20 mole %, preferably 5 to 15 mole %; $n_3$ is 15–85 mole %, preferably 20 to 65 mole %; $n_4$ is 0 to 40 mole %, preferably 0 to 20 mole %; and $n_5$ is 5–40 mole %, preferably 20 to 35 mole %.

The units may appear in any order in the polymer backbone and preferably occur in random order.

According to a second embodiment, this invention is a photosensitive composition comprising a diazonium compound and the novel acetal polymer set forth above.

According to a third embodiment, this invention is a photosensitive element useful as a lithographic printing plate comprising a metal substrate coated with a photosensitive composition, wherein the photosensitive composition comprises a diazonium compound and the novel acetal polymer set forth above. These photosensitive elements are developable by mildly alkaline or neutral pH developers.

DETAILED DESCRIPTION OF THE INVENTION

As indicated by the above structural formula, the acetal groups of the novel polymers of this invention are all six-membered cyclic acetal groups. One of the six-membered cyclic acetal groups includes a substituted aryl substitutent, $Ar_1$, as defined above. Another six-membered cyclic acetal is substituted with an acid functional group, $A_1$. The polymer may also include six-membered cyclic acetal groups which include an unsubstituted aryl group, $Ar_2$. The polymer also comprises vinyl acetate and vinyl alcohol units. The units occur in a random order. These polymers provide durable and solvent resistant printing plates.

Non-limiting examples of groups which may be used as $Ar_1$ include propylbenzyl, isopropylbenzyl, isobutylbenzyl, octylbenzyl, isoamylbenzyl, hexylbenzyl, pentylbenzyl, propxybenzyl, butoxybenzyl, pentyloxybenzyl, hexyloxybenzyl, octyloxybenzyl, and nonyloxybenzyl. Preferred $Ar_1$ groups are 4-isopropylbenzyl, 4-isobutylbenzyl, and 4-octyloxybenzyl.

Non-limiting examples of groups which may be used as $Ar_2$ include benzyl, napthyl, anthryl, and furyl. Preferred $Ar_2$ groups are benzyl and naphthyl.

Non-limiting examples of the acid group $A_1$ include —COOH; —COO$^-$M$^+$; —R$_1$COOH or —R$_1$COO$^-$M$^+$ where $R_1$ is an aliphatic group of 1–10 carbon atoms and M$^+$ is a cation selected from the group consisting of Na$^+$, K$^+$, Li$^+$, NH$_4^+$, (R$_4$)$_4$N$^+$ where $R_4$ is an alkyl group from 1 to 15 carbon atoms.

Preferred acid groups, $A_1$, have the formula

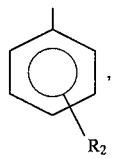

where
$R_2$ is selected from the group consisting of —COOH, —COO$^-$M$^+$, ―(CH$_2$)$_a$ COOH, —O—(CH$_2$)$_a$COOH, ―(CH$_2$)$_a$ CO O$^-$M$^+$, —O—(CH$_2$)$_a$CO O$^-$M$^+$, —SO$_3$H, —SO$_3^-$M$^+$, —O(CH$_2$)$_a$OSO$_3$H, —O(CH$_2$)$_a$—O—SO$_3^-$M$^+$, O(CH$_2$)$_a$—OPO$_3$H, —O(CH$_2$)$_a$—O—PO$_3^-$M$^+$, where a is an integer from 0 to 2 and M$^+$ is a cation selected from the group consisting of Na$^+$, K$^+$, Li$^+$, NH$_4^+$, (R$_4$)$_4$N$^+$ where $R_4$ is an alkyl group from 1 to 15 carbon atoms.

While not wishing to be bound to a particular theory, the inventors believe that the high concentration of easily abstractable benzylic (O—CHAr—O) hydrogen atoms together with the presence of a large amount of medium to long chain aliphatic groups on the aromatic rings give the novel polymers both of the desirable properties (solvent resistance and durability), without sacrificing either of the properties.

The polymers preferably have weight average molecular weights in the range of 5,000–200,000, more preferably 10,000–50,000.

The novel acetal polymers of this invention may be prepared by reacting a vinyl acetate/vinyl alcohol copolymer with aldehydes selected to provide the substitutions as defined before. Suitable techniques for forming polymers of this type are known to those skilled in the art. See e.g. U.S. Pat. Nos. 4,652,604; 4,940,646; and 5,169,898, all incorporated herein by reference. The inventors have discovered that neutralization of the acid group of the polymer by tetrabutyl ammonium hydroxide, rather than by sodium carbonate, provided polymers with increased solubility in non-toxic solvent and water mixtures, such as, propanol/water, 1-methoxy-2-propanol/water and methyl ethyl ketone/water.

The aldehydes suitable in preparing the first cyclic acetal group having an aliphatic substituted aromatic group, $Ar_1$, include: 4-isopropylbenzaldehyde, 4isobutylbenzaldehyde, 4-propylbenzaldehyde, 4-butylbenzaldehyde, 4-octylbenzaldehyde, 4-butoxybenzaldehyde, 4-octyloxybenzaldehyde, 4-nonyloxybenzaldehyde and the like.

The aldehydes suitable in preparing the acid substituted cyclic acetal group, $A_1$, include 2-formyl phenoxy acetic acid, glyoxylic acid, semisuccinaldehyde, 4-formyl phenoxy acetic acid, 2-carboxybenzaldehyde, 4-carboxybenzaldehyde, 2-formyl phenoxy sulfonic acid, 2-formyl phenoxy phosphonic acid, 2-formylbenzensulfonic acid, etc.

The aldehydes suitable in preparing the cyclic acetal group having an unsubstituted aromatic group, $Ar_2$, include: benzaldehyde, 1-naphthaldehyde, 2-naphthaldehyde, 9-anthraldehyde, furfural, and the like.

The acetal polymers of this invention may be combined with diazo resins to form photosensitive compositions. Suitable diazo resins include those which are known to be useful in lithographic printing plates. These include, for example, the condensation products of p-diazodiphenylamine and formaldehyde, paraformaldehyde or acetaldehyde, the condensation product of 3-methoxy-4-diazo diphenylamine and formaldehyde, paraformaldehyde or acetaldehyde, and the diazo resins of U.S. Pat. Nos. 2,063,415, 2,667,415, 2,667,498, 2,922,715, 2,946,683, 3,050,502, 3,163,633, 3,227,074, 3,311,605, 3,406,159, 3,679,419, 3,849,392, and 3,867,147. The preferred diazo resins are those which are soluble in aqueous and non-toxic organic solvents. Examples of such resins include triisopropylnaphthalene sulfonic acid salt of the condensation product of paraformaldehyde and p-diazodiphenylamine, and benzene diazonium, 2-methoxy4-phenylamino, salt with 2,4,6, trimethylbenzenesulfonic acid polymer with 1,1'-oxybis[4-(methoxymethyl)benzene] obtained as diazo NW 1428 from Hoechst Chemicals.

The photosensitive compositions preferably comprise about 15 to 50, more preferably 20 to 30, parts by weight of diazo resin, and about 20 to about 80, more preferably 40 to 60, parts by weight of the acetal polymers of this invention.

In addition to the diazo resin and the acetal polymers, the photosensitive compositions of this invention may also include such conventional additives as colorants, stabilizers, exposure indicators, coating aids, plasticizers, and other resins. The colorants could be either dyes or pigments. Effective stabilizers include both organic and inorganic acids, preferably oxalic, citric, phthalic, and phosphonic acids. The amounts of these stabilizers preferably would be about 2 to 6, more preferably 3 to 5, percent by weight of the photosensitive composition.

Useful exposure indicators include dyes which are pH sensitive and which do not couple with diazonium compounds. Examples of such dyes include eosin, azobenzene, Victoria blue, 4-phenylazo diphenylamine, methylviolet, and phenolphthalein. These dyes are preferably used in amounts from 0.01 to 3 percent by weight of the photosensitive composition.

Useful coating aids include fluorocarbon surfactants, such as FC-430 (Minnesota Mining and Manufacturing Co.). The surfactant is preferably used in amounts of about 0.1 to 4 percent by weight of the photosensitive composition.

The photosensitive composition may also contain free-radically polymerizable compounds, such as those discussed in U.S. Pat. Nos. 3,895,949; 4,037,021; 4,228,232; 5,235,015, and photoinitiators, such as those discussed in U.S. Pat. No. 3,775,113.

The photosensitive compositions of this invention are useful for lithographic printing plates and other photosensitive elements. The photosensitive element of this invention comprises a substrate coated with the photosensitive composition of this invention.

Suitable substrates include paper; paper laminated with plastics; plates formed from metal such as aluminum, aluminum alloys, zinc and copper; films of various plastics such as cellulose diacetate, cellulose triacetate, cellulose propionate, cellulose butyrate, cellulose acetatebutyrate, cellulose nitrate, polyethylene terephthalate, polyethylene, polystyrene, polypropylene, polycarbonate, and polyvinylacetal; paper or plastic films laminated or vapor-deposited with the above mentioned metals. Aluminum plates and aluminum sheets bonded to polyethylene terephthalate are preferred. Most preferably the aluminum substrates have been grained, for example by electrochemical graining, and anodized, for example with sulfuric and/or phosphoric acid. Such methods are well known to the skilled artisan.

In addition, the grained and anodized aluminum substrate may be sealed by immersion in such materials as sodium silicate solution or treatment with polyvinyl phosphonic acid, polyacrylamide, and cellulose derivatives. After graining, anodizing, and sealing, the support may be coated with a thin layer of a diazo compound.

To coat the photosensitive composition onto the substrate, the diazo resin, the acetal polymer, and any optional ingredients may be combined in a suitable solvent or mixture of solvents. If a pigment is being used as an additive, the pigment is first dispersed in a suitable binder and solvent and then the pigment dispersion is added to the other ingredients in solution. Particularly, useful solvents include mixtures of n-propanol and water, mixtures of 1-methoxy-2-propanol and water, and mixtures of methylethyl ketone and water.

The composition may be coated by any known method such as extrusion, spraying, dipping, wire wound rods, etc. The coating method may be determined based on the desired thickness of the layer. Preferably, the composition in solution is coated onto the substrate and dried at 50° to 140° C. The thickness of the photosensitive composition is preferably 0.5–2.0 μm, more preferably 0.75–1.5 μm.

The invention is further illustrated by the following example of its practice.

EXAMPLE 1

To a reaction vessel fitted with a water-cooled condensing column, were added 25 parts of AIRVOL™ 205 polyvinyl alcohol (an 88% hydrolyzed polyvinyl acetate having an average molecular weight of about 25,000 from Air Products Co.), 75 parts of distilled water and 150 parts of n-propanol. With continuous stirring, the mixture was heated at 90° C. for 3 hours. Then the temperature was adjusted to 60° C. and 3.4 parts of concentrated hydrochloric acid was added. A mixture of 20.28 parts of 4-isopropylbenzaldehyde, 8.41 parts 2-carboxybenzaldehyde, and 15 parts of n-propanol was then added over a period of 10 min. The reaction was continued for additional 6 hours. The mixture was allowed to cool to room temperature and potassium carbonate was added until a pH of 7.0 was obtained. The neutralized reaction mixture was then added to 800 parts of water to precipitate the polymer. The polymer was then washed with water, filtered and dried at 40° C. for 24 hours. The polymer is designated as PVA—OH/Acetyl/IPBA/CBA/2/12/61/25

The $Ar_1$ group is derived from 4-isopropyl benzaldehyde and has the formula

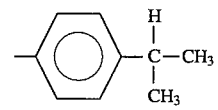

$A_1$ is derived from 2-carboxybenzaldehyde and has the formula

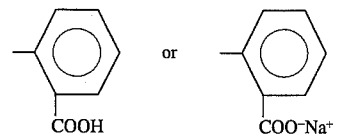

The hydroxyl and the acetyl group are derived from the unreacted hydroxyl and the non-reactive acetyl group of the starting poly vinyl alcohol. The value of $n_1$ is 2 mole %, the value of $n_2$ is 12 mole %, the value of $n_3$ is 61 mole %, the value of $n_4$ is 0 mole %, and the value $n_5$ is 25 mole %.

The novel aromatic group substituted acetal polymer prepared as described above was utilized in preparing a radiation sensitive coating composition of the following formulation:

| Component | Parts by Weight |
| --- | --- |
| Acetal polymer | 1.11 |
| Diazo Compound* | 0.30 |
| Phthalic Acid | 0.045 |
| PADA* | 0.015 |
| Basonyl Blue Dye (CT #42595) | 0.03 |
| 1-propanol/Water 72/28 | 23.51 |

Note: *Diazo compound = triisopropylnapthalene sulfonic acid salt of the condensation product of paraformaldehyde and p-diazodiphenylamine, PADA = 4-phenylazodiphenyl amine.

The radiation sensitive coating composition was coated on the surface of an aluminum support which had been electrochemically grained, anodized and silicated. After drying, the coating weight was found to be 100 mg/ft² (~1.0 g/m²). A portion of the dry coated plate was exposed for 14 units through a negative 21 step wedge test target in a vacuum exposure frame (Burges Industries of Minnesota) having a 5 kW bulb. The exposed plate was then processed through a Viking™ negative plate developer (an aqueous developer with a neutral pH, and composed of greater than 90% water from Minnesota Mining and Manufacturing Company). The plate showed a gray scale of solid 3 and a ghost step of 7, on the 21 step wedge. The plate resolved 1–99% dots at 150 lines per inch, and also resolved 6 μm lines. A solid image portion of the exposed plate was rubbed hard with a paper towel soaked with a Blanket and Roller wash (Rogersol, RVA 119; Rogersol Inc., Chicago, Ill.). No coating wear or removal could be observed, giving a rating of 5 on a scale of 1 to 5. A rating of 5 meaning no coating removal or attack, and a rating of 1 meaning total removal of the coating. A portion of the printing plate of the current invention, was run on a sheet-fed press using an aggressive mat ink known to wear plates quickly. The plate successfully ran 48,000 impressions before showing any wear on the solid image area. Highlight dots were still acceptable.

Comparative Example 2:

A polyvinyl acetal polymer having the following formula was prepared, using a similar procedure as above:

PVA—OH/Acetyl/p-anisaldehyde/2-CBA/2/12/61/25
(Note: 2-CBA=2-carboxy benzaldehyde)

This polymer is identical to the polymer in Example 1, except that instead of 4-isopropyl benzaldehyde, p-anisaldehyde is used as the aldehyde for the condensation reaction. This polymer was used to make a radiation sensitive composition as described in Example 1. The composition was coated to make a printing plate and then evaluated in the same manner as described in Example 1. The plate showed similar solvent resistance and resolution as the plate in Example 1. However, on the press test, the plate produced only 16,000 good impressions before showing wear on the solid image area. Compared to this, plate of the current invention (Example 1), produced 48,000 impressions.

Comparative Example 3:

A polyvinyl acetal polymer having the following structure was prepared, following a procedure as described in Example 1:

PVA—OH/Acetyl/BA/2-CBA/0/12/60/28

(Note: BA=Benzaldehyde, no unreacted hydroxyl group left; formula based on the charge of the reactants).

This polymer does not contain the group $Ar_1$. A printing plate was prepared with this polymer and evaluated in the same manner as described in Example 1. The plate showed similar solvent resistance (rating of 5), and resolution (6u). On the press test, however, the plate ran only half as long as plates of the present invention shown in Example 1

Comparative Example 4:

A polyvinyl acetal polymer disclosed in U.S. Pat. No. 5,169,898, table 1, Example 4, was prepared. This polymer contained acetal groups derived from aliphatic aldehydes. The structural formula is shown below:

PVA—OH/Acetyl/Butyl/Phenylbutaryl/FOA/4/12/13/49/22 (Note: FOA=2-formyl phenoxy acetic acid)

A printing plate was prepared with this polymer and evaluated in the same manner as described in Example 1. This plate showed a solvent resistance rating of 4 and a resolution of 6 μm lines. On the press test, the plate ran 92% of the plate in Example 1. Although, this plate performed fairly well, still the plate of the current invention (Example 1) performed better in both solvent resistance and press durability tests, as evident from the test results.

EXAMPLES 5–8:

These examples show the increased solubility of polymers that were neutralized with tetrabutyl ammonium hydroxide group. The polymers were prepared in a manner similar to that described in Example 1, except that after the reaction was completed, the solution was neutralized with tetrabutyl ammonium hydroxide instead of sodium carbonate. The rest of the procedure was similar to that described in Example 1. Portions of the dried polymers were then tested for solubility, by taking the polymers in bottles. Solvents were added to make 5% solutions, and the closed bottles were shaken for 24 hours. The results of the solubility test are shown in table 1. For comparison, results with polymers without the quaternary ammonium salt group are also shown in the table.

TABLE I

| Exp. | Polymer | Solvent | Solubility |
|------|---------|---------|------------|
| 5. | IPBA/CBA/61/25 | PGME/W/9/1 | N |
| 6. | IPBA/CBAQ/61/25 | as above | Y |
| 7. | IPBA/GOA/61/25 | PGME/W/9/1 | N |
| 8. | IPBA/GOAQ/61/25 | as above | Y |

Note: IPBA = isopropyl benzaldehyde, CBA = 2 = carboxybenzaldehyde, CBAQ = tetrabutylammonium salt of CBA, GOA = Glyoxalic acid, GOAQ = tetrabutylammonium salt of GOA, PGME = propyleneglycol methyl ether. The ratios indicate the mole percent of the aldehydes used for the acetalization reaction. These polymers were all derived from AIRVOL 205, and have the same amount of acetyl (12, mole %), and the same amount of unreacted hydroxyl group (2, mole %).

It is evident from the results in table 1, that polymers that contained the tetrabutyl ammonium quaternary salt group, are more soluble in the propylene glycol methyl ether/water mixture, than the polymers that did not contain the above group. The polymers in Examples 5, 6, 7, and 8 were, however, all found to be soluble in a solvent mixture of n-propanol/water at a ratio of 72/28. Thus, although these acetal polymers are all soluble in a highly polar solvent mixture as above, only the polymers containing the tetrabutyl ammonium quaternary salt group were found to be soluble in the less polar propyleneglycol methyl ether/water mixture. The increased solubility latitude provides increased latitude for the addition of other binders in the coating compositions. For example, cellulose acetate butyrate (CAB) is not soluble in the propanol/water mixture mentioned above, but it is soluble in the propylene glycol methyl ether and water mixture at a ratio of 9 to 1. CAB is known to be a good binder to improve roll up and may be useful in printing plate compositions containing the acetal resins of the present invention.

It was also found that a polymer having the following structure:

PVA—OH/Acetyl/IPBA/FBSAQ/2/12/81/5 was soluble in solvent mixture of MEK/water/95/5. Here, FBSAQ is the tetrabutyl ammonium quaternary salt of 2-formylbenzenesulfonic acid. This demonstrates that the polymer has solubility in a relatively non-polar solvent.

EXAMPLE 9

Following the procedure in Example 1, a polyvinyl acetal polymer was prepared by reaction of 5 parts of Airvol™ 203 (an 88% hydrolyzed polyvinyl acetate having an average molecular weight less than 20,000 from Air Products Co.), 4.14 parts of 4-isobutylbenzaldehyde, and 1.68 parts 2-carboxybenzaldehyde. After this reaction the solution was neutralized with tetrabutyl ammonium hydroxide. The polymer is designated as PVA—OH/Acetyl/IPBA/CBAQ/6/12/57/25.

The $Ar_1$, group is derived from 4-isobutylbenzaldehyde and has the formula:

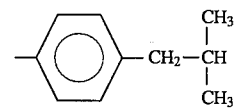

The $A_1$ group is derived from 2-carboxybenzaldehyde and has the formula:

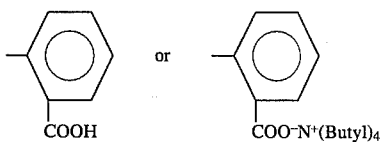

The above polymer was used in preparing a radiation sensitive composition having the following ingredients:

| Component | Parts by Weight |
| --- | --- |
| Acetal polymer | 10.06 |
| Diazo Compound* | 5.25 |
| Phthalic Acid | 0.525 |
| PADA | 0.175 |
| Ethyl Cellulose | 1.31 |
| Basonyl Blue Dye (CI #42595) | 0.175 |
| 1-propanol/Water 72/28 | 232.50 |

*Diazo NW 1428 from Hoechst Aktiengeseilschaft, Werk Kalle-Albert, D-65174 Wiesbaden.

This radiation sensitive coating composition was coated and evaluated in the same manner as described in Example 1. The solvent resistance test showed no coating wear giving a ranking of 5 on the press test. This plate ran slightly longer then the plate in Example 1.

EXAMPLE 10

The polyvinyl acetal polymer of Example 6 was used to make a formulation as described in Example 9, replacing the polyvinyl acetal polymer of Example 9. The radiation sensitive coating composition was coated and evaluated in the same manner as described in Example 1. The solvent resistant test showed no coating wear, giving a ranking of 5. On the press test, this plate ran slightly longer than the plate in Example 1.

What is claimed is:

1. A polymer having the formula:

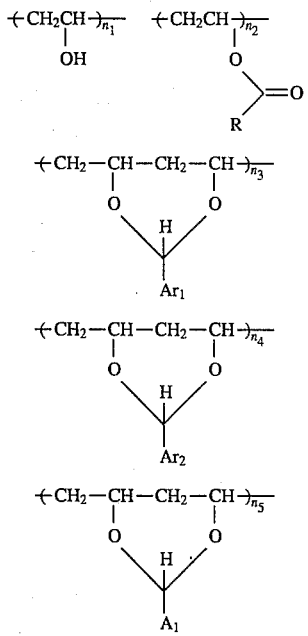

where

R is an alkyl group of 1 to 10 carbon atoms;

$Ar_1$ is an aromatic group substituted with an aliphatic group containing 3 to 20 carbon atoms or an alkoxy group having 3 to 20 carbon atoms;

$Ar_2$ is a non-substituted aromatic group;

$A_1$ is an acid group;

$n_1$, $n_2$, $n_3$, $n_4$, $n_5$ represent the molar percents of the respective repeating units, and $n_1$=0–20 mole %, $n_2$=2–20 mole %, $n_3$=15–85 mole %, $n_4$=0 to 40 mole %, and $n_5$=5–40 mole %.

2. The polymer of claim 1 wherein $n_1$ is 2–10 mole %, $n_2$ is 5 to 15 mole %, $n_3$ is 20 to 65 mole %, $n_4$ is 0 to 20 mole %, and $n_5$ is 20 to 35 mole %.

3. A photosensitive composition comprising the polymer of claim 1 and a photosensitive component.

4. The photosensitive composition of claim 3 wherein the photosensitive component is diazo resin.

5. The photosensitive composition of claim 4 wherein the weight ratio of the diazo resin to the polymer is in the range of 1:1 to 1:10.

6. A photosensitive element comprising a substrate, and coated on the substrate the photosensitive composition of claim 4.

7. The polymer of claim 1 wherein $A_1$ is selected from the group consisting of —COOH; —COO$^-$M$^+$; —R$_1$COOH or —R$_1$COO$^-$M$^+$ where R$_1$ is an aliphatic group of 1–10 carbon atoms; and those groups having the formula

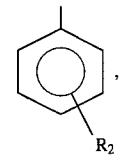

where $R_2$ is selected from the group consisting of —COOH, —COO$^-$M$^+$, —(CH$_2$)$_a$ COOH, —O—(CH$_2$)$_a$COOH, —(CH$_2$)$_a$ CO O$^-$M$^+$, —O—(CH$_2$)$_a$CO O$^-$M$^+$, —SO$_3$H, —SO$_3^-$M$^+$, —O(CH$_2$)$_a$—OSO$_3$H, —O(CH$_2$)$_a$—O—SO$_3^-$M$^+$, —O(CH$_2$)$_a$—OPO$_3$H and —O(CH$_2$)$_a$—O—PO$_3^-$M$^+$, where a is an integer from 0 to 2 and M$^+$ is a cation selected from the group consisting of Na$^+$, K$^+$, Li$^+$, NH$_4^+$ and (R$_4$)$_4$N$^+$ where R$_4$ is an alkyl group from 1 to 15 carbon atoms.

8. The polymer of claim 7 wherein M$^+$ is tetrabutyl ammonium.

9. The polymer of claim 7 wherein $Ar_1$ is selected from the group consisting of propylbenzyl, isopropylbenzyl, isobutylbenzyl, octylbenzyl, isoamylbenzyl, hexylbenzyl, pentylbenzyl, propxybenzyl, butoxybenzyl, pentyloxybenzyl, hexyloxybenzyl, octyloxybenzyl, and nonyloxybenzyl.

10. The polymer of claim 9 wherein $Ar_1$ is selected from the group consisting of 4-isopropylbenzyl, 4-isobutylbenzyl, and 4-octyloxybenzyl.

11. The polymer of claim 1 wherein $Ar_2$ is selected from the group consisting of benzyl, napthyl, anthryl, and furyl.

* * * * *